United States Patent
Gluche et al.

(10) Patent No.: US 6,599,178 B1
(45) Date of Patent: Jul. 29, 2003

(54) DIAMOND CUTTING TOOL

(75) Inventors: Peter Gluche, Neu-Ulm (DE); Andre Flöter, Sontheim/brenz (DE)

(73) Assignee: GFD Gesellschaft fur Diamantprodukte mbH (DE)

( * ) Notice: Subject to any disclaimer, the term of this patent is extended or adjusted under 35 U.S.C. 154(b) by 0 days.

(21) Appl. No.: 09/601,183

(22) PCT Filed: Jan. 27, 1999

(86) PCT No.: PCT/EP99/00532

§ 371 (c)(1),
(2), (4) Date: Jul. 27, 2000

(87) PCT Pub. No.: WO99/37437

PCT Pub. Date: Jul. 29, 1999

(30) Foreign Application Priority Data

| Jan. 27, 1998 | (DE) | 198 02 980 |
| Dec. 23, 1998 | (DE) | 198 59 905 |

(51) Int. Cl.⁷ .................................................. B24B 5/00
(52) U.S. Cl. ........................ 451/540; 451/548; 451/552
(58) Field of Search .................... 451/41, 540, 548, 451/552, 553

(56) References Cited

U.S. PATENT DOCUMENTS

| 3,154,856 | A |   | 11/1964 | Camp et al. |   |
|---|---|---|---|---|---|
| 4,534,827 | A |   | 8/1985 | Henderson |   |
| 4,927,300 | A |   | 5/1990 | Ramalingam et al. |   |
| 4,980,021 | A |   | 12/1990 | Kitamura et al. |   |
| 5,037,704 | A | * | 8/1991 | Nakai et al. | 428/550 |
| 5,317,938 | A |   | 6/1994 | de Juan, Jr. et al. |   |
| 5,347,887 | A | * | 9/1994 | Rosenthal et al. | 76/104.1 |
| 5,955,212 | A | * | 9/1999 | Matsumoto et al. | 428/698 |

FOREIGN PATENT DOCUMENTS

| DE | 198 59 905 A 1 | 9/1999 |
| EP | 56112475 | 9/1981 |
| EP | 04193974 | 7/1992 |
| EP | 0 577 066 A1 | 6/1993 |
| EP | 0 670 192 A1 | 2/1995 |
| EP | 070776775 | 3/1995 |
| EP | 08191838 | 7/1996 |
| GB | 1 350 594 | 2/1970 |
| WO | WO 98/03292 | 1/1998 |
| WO | WO98/04382 | 2/1998 |

* cited by examiner

Primary Examiner—M. Rachuba
(74) Attorney, Agent, or Firm—Young & Basile, P.C.

(57) ABSTRACT

A cutting tool with a synthetic diamond layer 2 having a cutting edge 5 is described, wherein the cutting edge 5 has a profile structured by etching of decreasing layer thickness. Furthermore, a process is described for producing such a cutting tool.

9 Claims, 4 Drawing Sheets

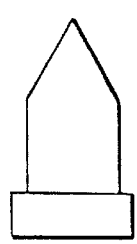   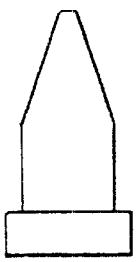 
FIG. 2A   FIG. 2B   FIG. 2C   FIG. 2D   FIG. 2E
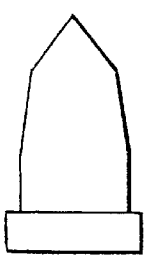   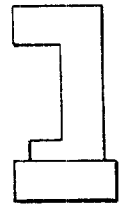 
FIG. 2F   FIG. 2G   FIG. 2H   FIG. 2I   FIG. 2J
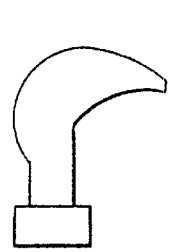 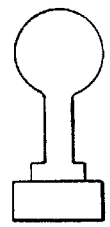  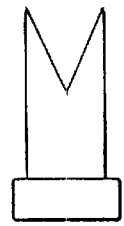 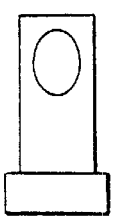
FIG. 2K   FIG. 2L   FIG. 2M   FIG. 2N   FIG. 2O
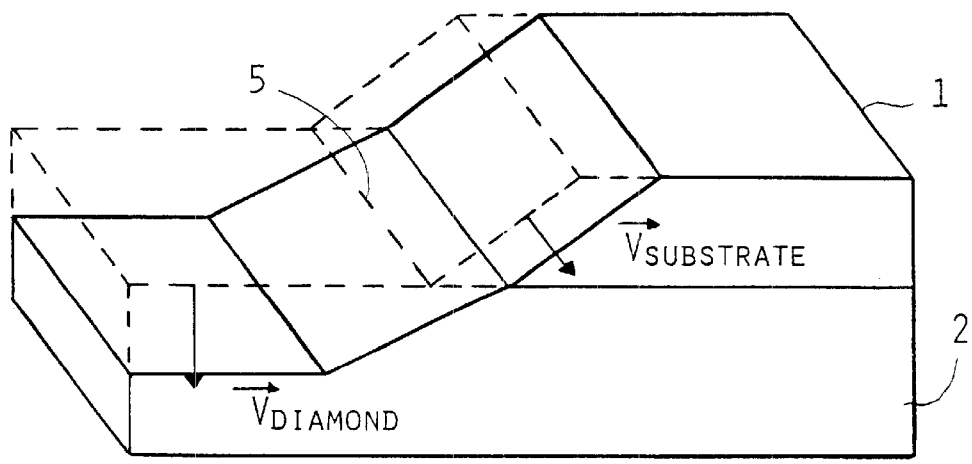
FIG. 3

DIAMOND CUTTING TOOL

The invention relates to a diamond cutting tool with a synthetic diamond layer having a cutting edge, and a process for producing a diamond cutting tool.

Diamond is a suitable material for cutting tools due to its excellent mechanical, chemical, thermal and electrical properties. A diamond cutting tool having a substrate and a cutting edge element based on diamond arranged on the substrate is known from European application 0 577 066. The cutting edge element may comprise a diamond layer deposited from the vapour phase. The cutting edge element is structured with the aid of a laser beam and then attached to the substrate material. The disadvantages of this cutting tool are the high production costs due to the expensive laser structuring of the cutting edge and the attachment of the cutting edge element to the substrate material which is not simple in terms of process engineering. It is also disadvantageous that the cutting edge angle cannot be set to be as small as required.

In the introduction of European application 0 577 066, a diamond cutting tool made from a substrate material which is coated with diamond is described as state of the art. However, the disadvantage of this diamond cutting tool is that the thin film of diamond is separated from the substrate material during cutting.

Starting from the disadvantages of the state of the art, the object of the invention is to indicate a diamond cutting tool which can be produced in simple manner in large numbers and cost-effectively, has considerable sharpness and mechanical stability and may be provided with any shape cutting surfaces. The object of the invention is also to indicate a process for producing such a diamond cutting tool.

This object is achieved by a cutting tool according to claim 1 and a process for producing a cutting tool according to claim 12. The particular sub-claims relate to preferred embodiments and further developments of the invention.

A diamond cutting tool can be produced in simple manner and has a cutting edge of considerable sharpness if the cutting edge of the synthetic diamond layer has a profile of decreasing layer thickness which is structured by etching. During production of this diamond cutting tool, after depositing the diamond layer on a preferably crystalline substrate material, the cutting edge is formed by carrying out one or more etching steps. During etching, an etching mask is used which is etched separately from the diamond layer or at the same time as the diamond layer. The optionally structured substrate material and/or one or more optionally structured further layers, which have been applied to the diamond layer, may act as etching mask. The angle of the cutting edge can be set specifically by varying the ratio of the etching rates of etching mask and diamond layer.

Cost-effective production, which can be automated, of the diamond cutting tool according to the invention is guaranteed in high numbers, if the diamond layer is initially deposited on a large surface area support material, and before carrying out the at least one etching step to produce the cutting edge, structuring of the etching mask is carried out to define individual cutting tools of any geometry.

The diamond layer is preferably textured and particularly preferably has a <111>, or <110> or <100> texture. A texture is meant when more than 80% of the surface of the diamond layer is formed by <111>, or <110> or <100> diamond surfaces, and the difference of the Euler angle $\Delta\gamma$ between the <111>, <110> or <100> diamond surfaces lying against one another and defining the orientation of the diamond layer, fulfils the condition $|\Delta\gamma| \leq 20°$. The thickness of the diamond layer is preferably between 1 and 500 $\mu$m and the average surface roughness $R_A$ preferably less than 5 $\mu$m. Following the deposition of the diamond layer, the latter may be further processed mechanically, physically or chemically to reduce optionally existing surface roughness of the diamond layer.

The diamond layer may be deposited on preferably etchable substrate materials, such as silicon, silicon carbide, glass, refractory metals, sapphire, magnesium oxide or germanium. It has been shown that the diamond film still lies on a substrate (1 monolayer 20 nm SiC) after removing the Si layer and is not co-removed during removal.

The cutting edge of the diamond cutting tool is preferably defined by a dry-chemical etching step, such as for example reactive ion etching. Etching mask and diamond layer may be etched at the same time in a single etching step. Alternatively, it is possible to etch etching mask and diamond layer separately in two or more etching steps. If more than two etching steps are carried out, a graded profile may be formed in the diamond layer. By varying the ratios of the reactive glass components during etching it is possible to exert influence on the shape of the cutting edge. For example, arched cutting edges can be realised in this manner. The profile of the etching process may also be defined as stepped/graded profile, which has as minimum step height the lattice constant of the diamond (a=3.5 Å).

Further details and preferred embodiments of the invention can be seen from the exemplary embodiments and the figures.

FIG. 2 shows different shapes of cutting tools of the invention;

FIG. 3 shows a schematic representation of the etching process of the invention for structuring the cutting edge;

Figure 1:
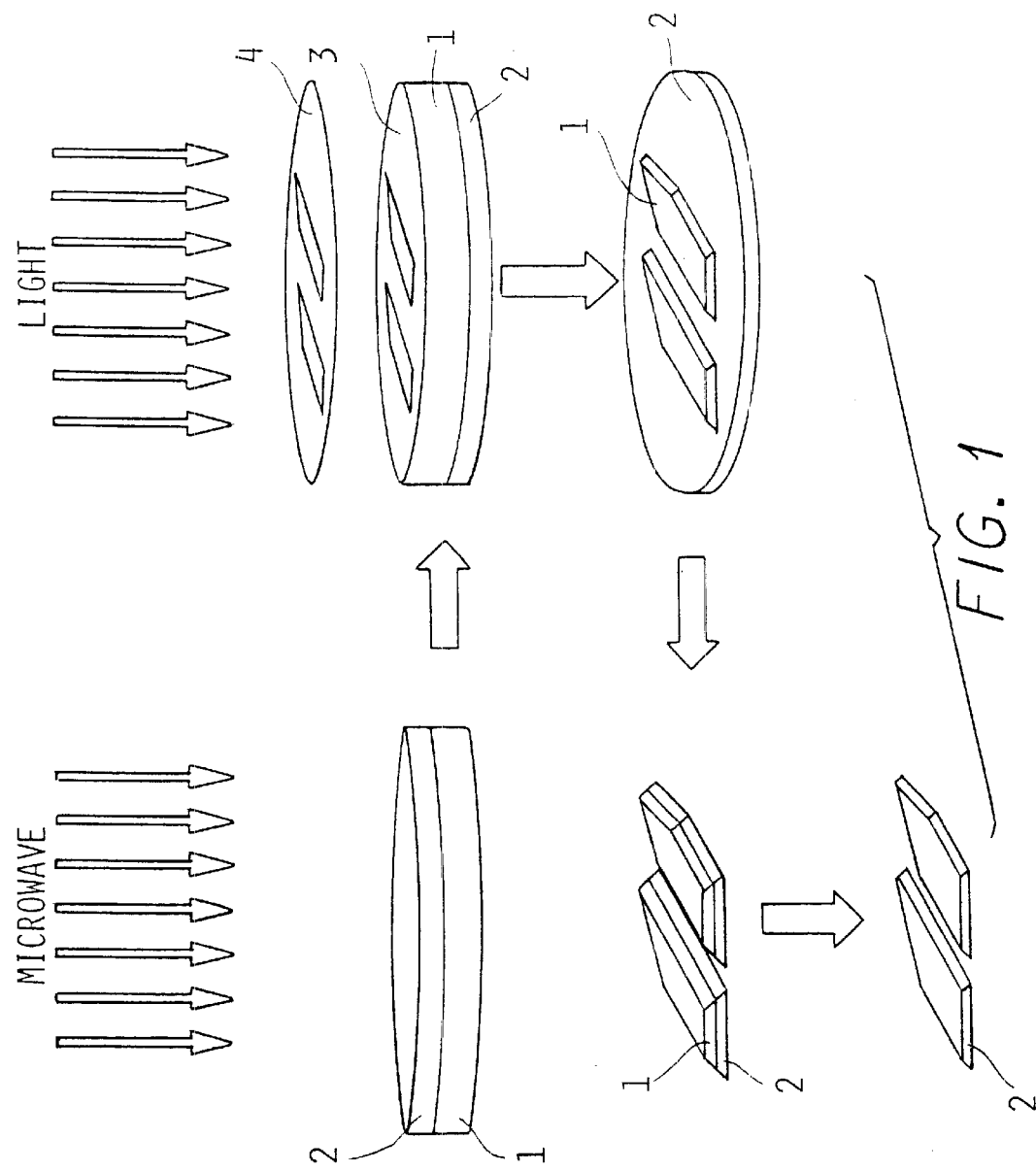
FIG. 1 shows the individual steps for producing the cutting tool of the invention.

The production of a cutting tool of the invention is described below by way of example with reference to FIG. 1. First of all plasma coating of a large surface area silicon substrate 1 with polycrystalline diamond 2 takes place. The deposited synthetic diamond layer 2 has a thickness of about 35–100 $\mu$m and has very low surface roughness due to its <100> texture.

Following coating of the silicon substrate 1, whole surface masking 3 of the substrate 1 takes place using $Si_3N_4$. The $Si_3N_4$ is then structured by means of standard photolithography using a glass mask 4 for definition of the shape of the individual cutting tools. Wet-chemical exposure of the diamond layer 2 then follows by etching the substrate 1 with KOH solution (30 wt. %) at 80° C. By means of this process, the cutting tool shapes shown in FIG. 2 can also be realised in addition to those shown in FIG. 1. Instead of or additionally to the substrate 1 as etching mask, one or more further layers could be applied to the diamond layer, and are structured as described above and act as etching mask. These further layers may be, for example silicon, lacquer or metallic layers or silicon-containing layers ($SiO_2$, $Si_3N_4$ etc.).

The cutting edge is formed by subsequent reactive ion etching in a parallel plate reactor. The wet-chemically structured silicon substrate 1 thus acts as etching mask. A $CF_4/Ar/O_2$ mixture is used as process gas. The etching rate of the silicon is determined by the $CF_4$ portion and the etching rate of diamond by the $O_2/Ar$ portion. The etching rate of the silicon in the present case is higher than the etching rate of the diamond layer, so that a cutting edge angle α of less than 45° is produced. However, the etching rate of silicon may also be selected to be equal (α=45°) or lower (α>45°) than that of diamond.

Figure 4:
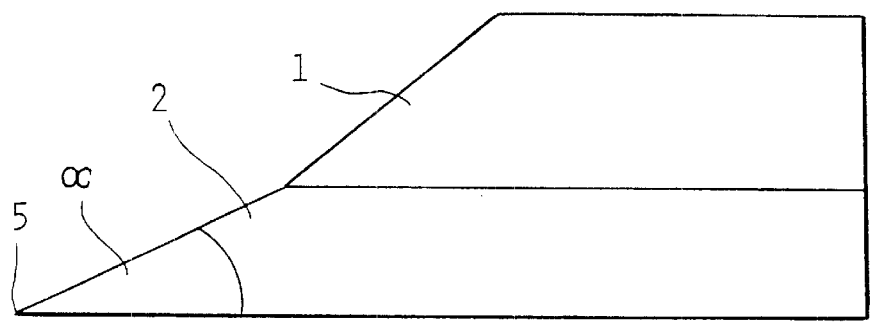
FIG. 4 shows the cutting edge of a cutting tool of the invention.

FIG. 3 shows schematically the etching process for structuring the cutting edge 5. The dashed lines mark the initial positions of substrate material 1 and diamond layer 2 before the dry-etching process. During the etching process, the masking substrate material 1 is continuously removed at the etching rate $V_{substrate}$. An etching process at the etching rate $V_{diamond}$ then takes place at the thus exposed diamond surfaces. The angle α of the finally etched diamond cutting edge 5 (see FIG. 4) may be defined via the ratio of the amounts of the vectorial etching rates of substrate material 1 and diamond layer 2 as follows:

$$\tan\alpha = k \cdot V_{diamond}/V_{substrate}$$

k represents a constant in the above formula.

The etching rates of substrate 1 and diamond layer 2 are set primarily via the portions of the reactive components of the process gas mixture. In the case of silicon, for example an increase in reactive component $CF_4$ means a reduction in cutting edge angle.

In the following table examples of process parameters at bias voltages between 500 and 550 V and electrical powers between 1,400 and 1,500 W are summarised:

| Ar [sccm] | $O_2$ [sccm] | $CF_4$ [sccm] | Pressure [in Torr] | α |
|---|---|---|---|---|
| 25 | 60 | 3.0 | 75 | 32.5° |
| 25 | 60 | 1.0 | 75 | 58° |
| 25 | 60 | 10.0 | 75 | 17.5° |
| 25 | 60 | 0 | 75 | 90° |

The particular process parameters are strongly dependent on the plant. However, typical process parameters lie in the following ranges.

Ar: 10–50 sccm $O_2$: 20–150 sccm $CF_4$: 0.1–30 sccm $V_{bias}$: 250–700 V

P: 300–3,000 W

Further etching gas compositions for dry-chemical etching of diamond contain, for example $H_2$, $O_2$, $CF_4$ and Ar. The following 12 compositions and further mixtures of the components indicated are suitable for dry-chemical etching of silicon:

| 1 | Ar | $BCl_3$ | $Cl_2$ | $CF_4$ | $F_2$ |
|---|---|---|---|---|---|
| 2 |  | $BCl_3$ | $Cl^+$ | $CF_4/O_2$ | F |
| 3 | $H_2$ | $BCl_3/PCl_3$ | $ClF_3$ | $CF_4/NO$ | $F^+$ |
| 4 |  | $BF_n$ | $CBrF_3$ | $CF_4/CO_2$ |  |
| 5 | HF | $BF_3$ | $CClF_3$ | $CF_4/C_2H_4$ | $SiF_4$ |
| 6 |  |  | $CCl_2F_2$ | $CF_4$/wet air |  |
| 7 |  |  | $CCl_3F$ | $CF_n^+$ | $SF_6$ |
| 8 |  |  | $C_2ClF_5$ | $C_2F_4$ | $SF_4^+$ |
| 9 |  |  | $C_2Cl_2F_4$ | $C_2F_6$ |  |
| 10 |  |  | $CCl_4$ | $C_2F_8$ |  |
| 11 |  |  |  | $C_4F_8$/He |  |
| 12 |  |  |  | $SiCl_4$ |  |

It is often desirable to have a coloured (that is not transparent) cutting edge (5). For this purpose, the diamond layer may be bombarded with energy-rich particles (for example electrons), to produce optically active lattice defects.

Figures 5A, 5B, 5C, 5D:
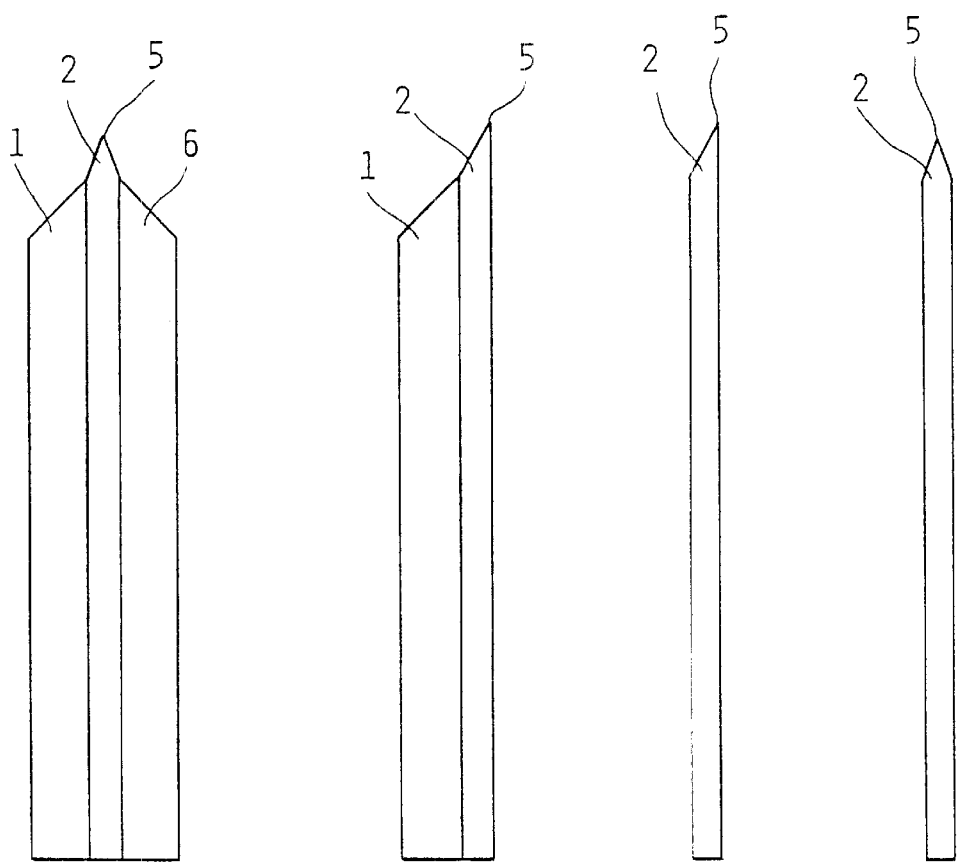
FIG. 5 shows sectional views of the cutting tool of the invention.

FIG. 5 shows etched diamond cutting tools in side view. In the two left-hand cutting tools, the silicon substrate material 1 has not been completely etched, so that the substrate 1 acts as a mechanical stabiliser. However, it is possible to completely etch-away the silicon substrate material 1 (FIG. 5, on the right of both cutting tools). A further masking layer 6 made from, for example silicon instead of the etched-away substrate material 1, may also be applied or may be applied to the side of the diamond layer 2 facing away from the substrate material 1 (FIG. 5, left). For the cutting tool on the far right, both substrate material and the further layer have been removed again after structuring of the cutting edge.

Figure 7:
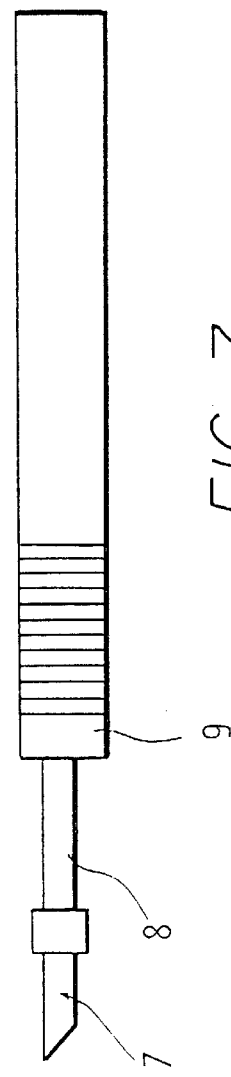
FIG. 7 shows a scalpel with a cutting tool of the invention.

FIG. 7 shows a scalpel with handle 9 having a mounting 8 and a cutting tool 7 attached in the mounting 8. Scalpels 9 of this type are suitable, for example for eye surgery (for example for corneal incisions and fako anterior chamber openings) or other surgical interventions, such as minimal-invasive or plastic surgery. Extremely smooth cutting surfaces may be realised using the scalpel 9 due to the extreme sharpness of the cutting tool 7 of the invention. The materials of the cutting tool 7 are mechanically stable, chemically inert and biologically acceptable.

In addition, any active and/or passive electronic components or circuits can be integrated into the diamond cutting tool. For this purpose, the diamond may also be doped with electrically active imperfections. Hence, for example sensors for measuring physical and chemical parameters, such as for example cutting tool temperature (temperature sensor), the forces on the cutting edge (piezoresistive or piezoelectric sensor) or electrical or chemical potentials (diamond electrode), can be integrated into the cutting tool. Furthermore, integration of actuators, such as for example heating elements (resistance heating element or high-frequency heating element) is possible. The integration of a structure for radiating electromagnetic or ultrasound waves (for example antenna), for example for determination of the position of the cutting tool, is likewise conceivable.

Figure 6:
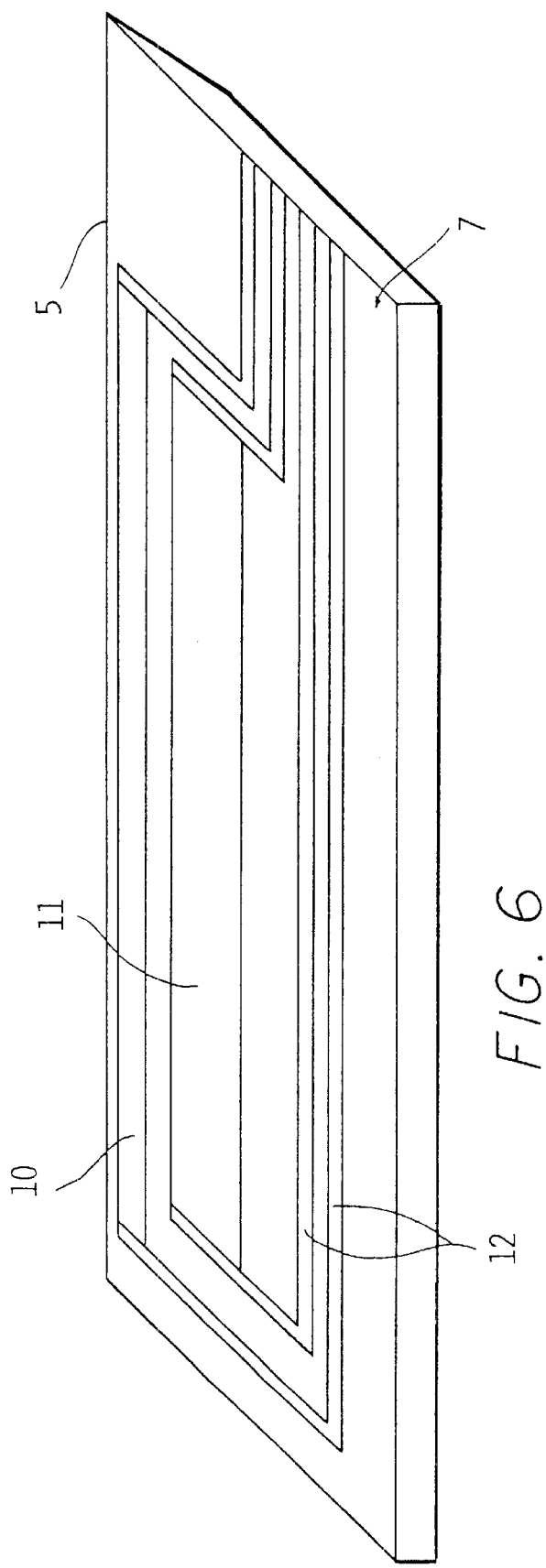
FIG. 6 shows the integration of electronic components with a cutting tool of the invention.

FIG. 6 shows a diamond cutting tool 7 with completely etched-away support material, on which a heating element 11, a temperature sensor 10 and electrical connections 12 are arranged. Both heating element 11 and temperature sensor 10 can likewise be made from diamond. The temperature sensor guarantees very high temperature stability and the thermal conductivity of diamond guarantees extremely uniform temperature distribution.

What is claimed is:

1. Cutting tool with a synthetic diamond layer having a cutting edge on the synthetic diamond layer, said synthetic diamond layer having a thickness of 1 to 500 μm, wherein the cutting edge has a profile of decreasing layer thickness, wherein the synthetic diamond layer is arranged directly onto a surface of a depositing substrate material.

2. Cutting tool according to claim 1, wherein the diamond layer is textured.

3. Cutting tool according to claim 1, wherein the diamond layer has one of a <111>, <100> and <110> texture.

4. Cutting tool according to claim 1, wherein the diamond layer has n average surface roughness of $R_A < 5$ μm.

5. Cutting tool according to claim 1, wherein the cutting edge has a graded profile.

6. Cutting tool according to claim 1, wherein the substrate material is selected from silicon, silicon carbide, glass, refractory metals, sapphire, magnesium oxide and germanium.

7. Cutting tool according to claim 1, wherein the diamond layer is doped.

8. Cutting tool according to claim 1, wherein an electronic component is integrated into the cutting tool.

9. Cutting tool according to claim 1, wherein at least one of a sensor and an actuator is integrated into the cutting tool.

* * * * *

UNITED STATES PATENT AND TRADEMARK OFFICE
CERTIFICATE OF CORRECTION

PATENT NO. : 6,599,178 B1  Page 1 of 1
DATED : July 29, 2003
INVENTOR(S) : Peter Gluche, Stephan Ertl and Erhard Kohn It is certified that error appears in the above-identified patent and that said Letters Patent is hereby corrected as shown below:

<u>Title page,</u>
Item [75], Inventor, delete "Andre Flöter, Sontheim/brenz (DE)" and add the following:
-- Stephan Ertl, Ulm (DE)
Erhard Kohn, Ulm (DE) --

Signed and Sealed this

Eighth Day of June, 2004

JON W. DUDAS
*Acting Director of the United States Patent and Trademark Office*